United States Patent
Wuu et al.

(10) Patent No.: US 8,022,412 B2
(45) Date of Patent: Sep. 20, 2011

(54) EPITAXIAL STRUCTURE HAVING LOW DEFECT DENSITY

(75) Inventors: Dong-Sing Wuu, Taichung (TW);
Ray-Hua Horng, Taichung (TW);
Shih-Ting Chen, Taichung (TW);
Tshung-Han Tsai, Taichung (TW);
Hsueh-Wei Wu, Taichung (TW)

(73) Assignee: National Chung-Hsien University, Taichung (TW)

( * ) Notice: Subject to any disclaimer, the term of this patent is extended or adjusted under 35 U.S.C. 154(b) by 125 days.

(21) Appl. No.: 12/688,005

(22) Filed: Jan. 15, 2010

(65) Prior Publication Data

US 2010/0181576 A1 Jul. 22, 2010

(30) Foreign Application Priority Data

Jan. 21, 2009 (TW) ................................ 98102240 A (51) Int. Cl.
*H01L 29/20* (2006.01)
*H01L 29/15* (2006.01)

(52) U.S. Cl. ............ 257/76; 257/79; 257/190; 257/615; 257/631; 257/E33.005; 257/E33.025; 257/E33.043; 257/E29.089; 257/E29.105; 257/E21.09; 257/E21.097; 257/E21.03; 438/758; 438/141; 438/156

(58) Field of Classification Search .................... 257/76, 257/190, 615, 631, 79, E29.089, E33.005, 257/E33.025, E33.043, E29.105, E29.106, E21.09, E21.097, E21.103; 438/758; 428/141, 156

See application file for complete search history.

(56) References Cited

U.S. PATENT DOCUMENTS

| | | | | |
|---|---|---|---|---|
| 3,976,512 | A * | 8/1976 | De Nora et al. | 438/499 |
| 6,111,277 | A * | 8/2000 | Ikeda | 257/99 |
| 6,468,347 | B1 * | 10/2002 | Motoki et al. | 117/89 |
| 7,198,971 | B2 * | 4/2007 | Shin | 438/44 |
| 7,342,261 | B2 * | 3/2008 | Wuu et al. | 257/190 |
| 2005/0045894 | A1 * | 3/2005 | Okuyama et al. | 257/95 |
| 2006/0071234 | A1 * | 4/2006 | Irikura et al. | 257/103 |
| 2006/0273343 | A1 * | 12/2006 | Nakahata et al. | 257/103 |

* cited by examiner

*Primary Examiner* — Lynne Gurley
*Assistant Examiner* — Naima Kearney
(74) *Attorney, Agent, or Firm* — Whyte Hirschboeck Dudek SC (57) ABSTRACT

An epitaxial structure having a low defect density includes: a base layer; a first epitaxial layer having a plurality of concentrated defect groups, and an epitaxial surface that has a plurality of first recesses corresponding in position to the concentrated defect groups, the sizes of the first recesses being close to each other; and a plurality of defect-termination blocks respectively and filling the first recesses and having polished surfaces. The defect-termination blocks are made of a material which is different in removal rate from that of the first epitaxial layer. The polished surfaces are substantially flush with the epitaxial surface so that the first epitaxial layer has a substantially planarized crystal growth surface

12 Claims, 9 Drawing Sheets

EPITAXIAL STRUCTURE HAVING LOW DEFECT DENSITY

CROSS-REFERENCE TO RELATED APPLICATION

This application claims priority of Taiwanese application No. 098102240, filed on Jan. 21, 2009.

BACKGROUND OF THE INVENTION

1. Field of the Invention

This invention relates to an epitaxial structure, more particularly to an epitaxial structure having a low defect density and usable as a substrate for forming a semiconductor device thereon.

2. Description of the Related Art

In gallium nitride based light-emitting devices, a sapphire substrate or a silicon carbide substrate is usually used for growth of gallium nitride-based layers thereon. During growth of the gallium nitride-based semiconductor layers on the substrate, dislocations due to the lattice mismatching are formed and propagate into the active layer of the light-emitting device, thereby reducing light emitting efficiency thereof.

U.S. Pat. Nos. 6,051,849 and 6,608,327B1 disclose a semiconductor structure including a base layer on which a buffer layer, a first epitaxial layer and a patterned silicon dioxide layer are sequentially stacked. Subsequently, a second epitaxial layer is formed on the first epitaxial layer and the patterned silicon dioxide layer using lateral epitaxial overgrowth techniques. By covering portions of the first epitaxial layer with the patterned silicon oxide layer, defects or dislocations in the second epitaxial layer, which propagate from the first epitaxial layer, can be reduced. Therefore, dislocations formed in the active layer can also be reduced, which results in improvement of light emitting efficiency of the light-emitting device when formed on the semiconductor structure.

However, an increase in epitaxial layers may cause a decrease in yield. In addition, when the number of the epitaxial layer increases, the reduction of the defects attenuates, which fails to effectively improve quantum efficiency of the light-emitting device.

U.S. Patent Application Publication No. 2008/0068291A1 discloses a semiconductor structure including a patterned base layer formed with a plurality of recesses, and a first epitaxial layer formed on the patterned base layer. Subsequently, a patterned mask is stacked on the first epitaxial layer in positions corresponding to recess-free regions for preventing defect propagation therethrough.

Figure 1:
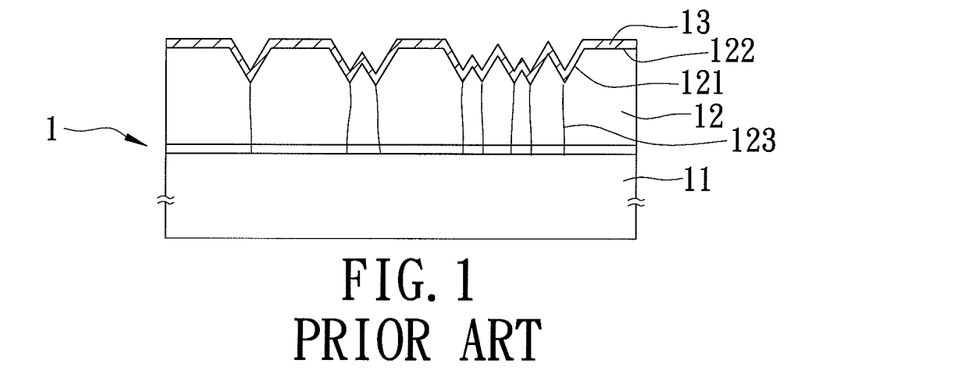
FIGS. 1 to 3 are views to illustrate a method of making a conventional epitaxial structure.
Figure 2:
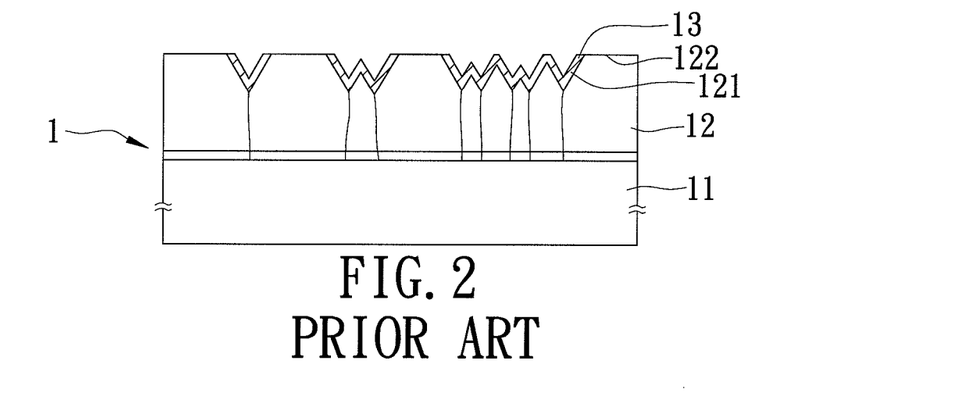
Figure 3:
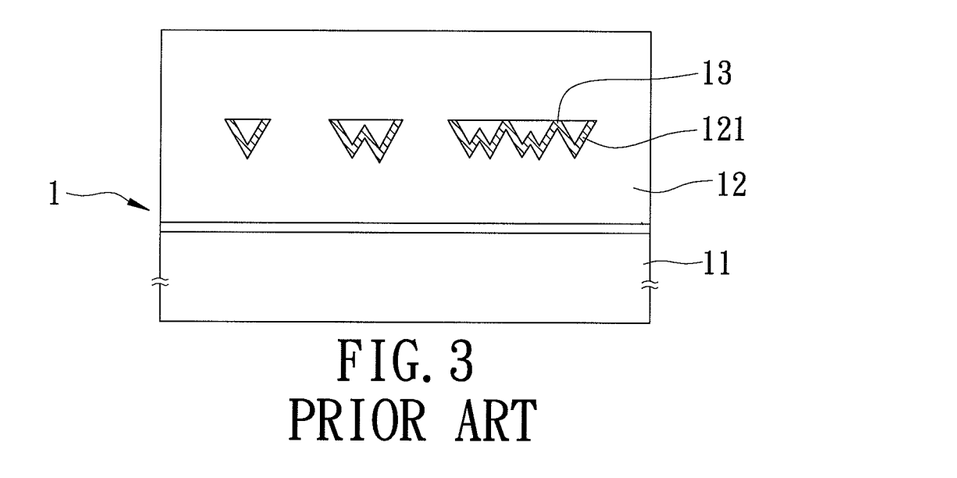

U.S. Pat. No. 7,364,805B2 discloses a method of forming spontaneously a plurality of recesses in positions corresponding to dislocations by etching without patterning by a mask. Referring FIGS. 1 to 3, an epitaxial substrate 1 includes a base layer 11, a first epitaxial layer 12, and a coated film 13. The first epitaxial layer 12 has an epitaxial surface 122, a plurality of defects 123, and a plurality of etch pits 121 formed corresponding to the defects 123. The coated film 13 is formed on the epitaxial surface 122 and in the etch pits 121. Then, the coated film 13 formed on the epitaxial surface 122 is removed using reactive ion etching (RIE) techniques for subsequent growth of epitaxial layers thereon. However, defects are prone to increase during removal of the coated film 13 using reactive ion etching techniques. In addition, the etch pits 121 are formed on top ends of the defects including screw dislocations and edge dislocations due to etching by heat and gas.

SUMMARY OF THE INVENTION

Therefore, an object of the present invention is to provide an epitaxial substrate structure that can overcome the aforesaid drawbacks associated with the prior art.

According to the present invention, an epitaxial structure having a low defect density comprises: a base layer; a first epitaxial layer formed on the base layer and having a lattice mismatch with the base layer, the first epitaxial layer further having a plurality of concentrated defect groups, and an epitaxial surface that has a plurality of first recesses corresponding in position to the concentrated defect groups, the sizes of the first recesses being close to each other; and a plurality of defect-termination blocks respectively and filling the first recesses and having polished surfaces. The defect-termination blocks are made of a material which is different in removal rate from that of the first epitaxial layer. The polished surfaces are substantially flush with the epitaxial surface so that the first epitaxial layer has a substantially planarized crystal growth surface.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 4:
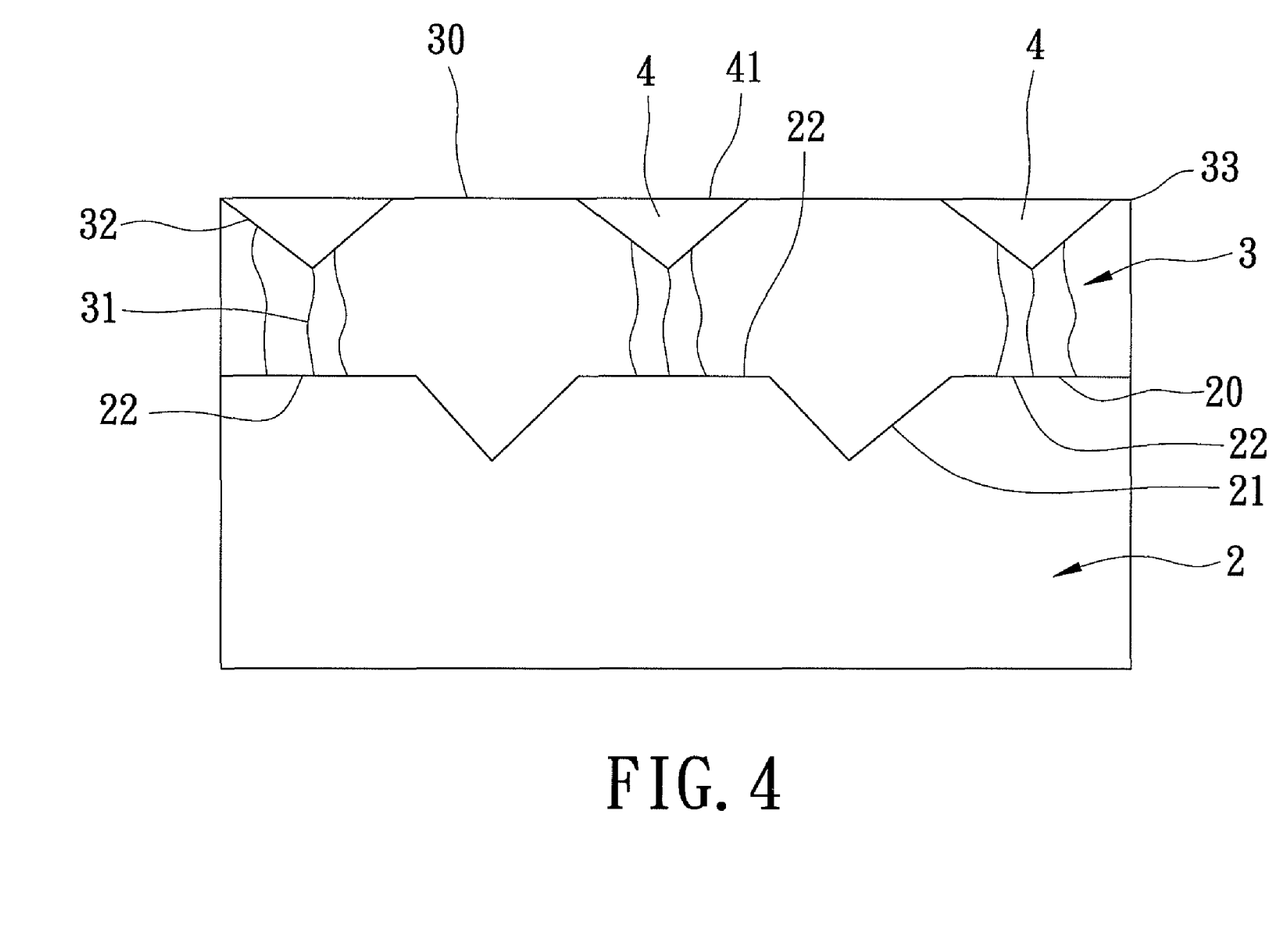
FIG. 4 is a schematic view of the first preferred embodiment of an epitaxial structure according to this invention.
Figure 5A:
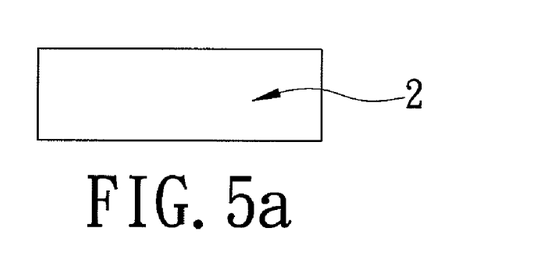
FIGS. 5a to 5g are views to illustrate consecutive steps of the first preferred embodiment of a method of making the epitaxial structure according to this invention.
Figure 5B:
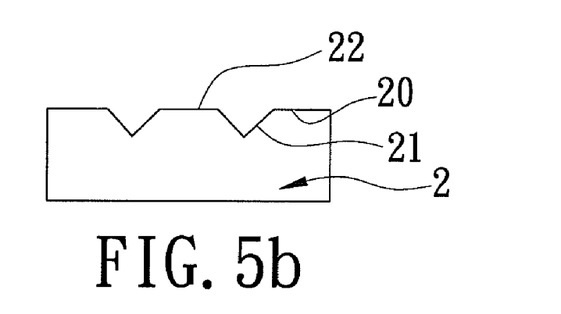
Figure 5C:
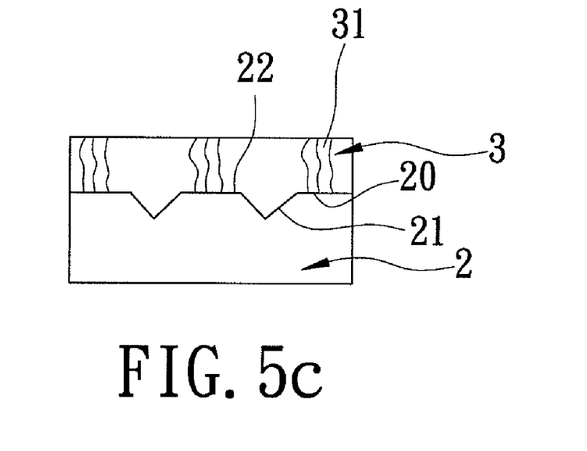
Figure 5D:
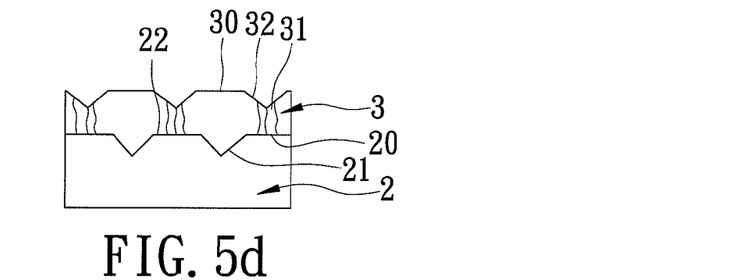
Figure 5E:
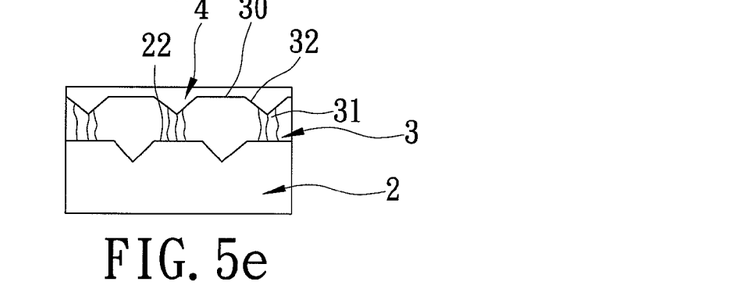
Figure 5F:
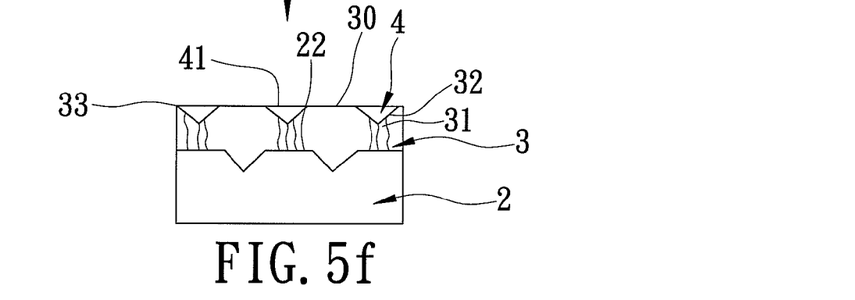
Figure 5G:
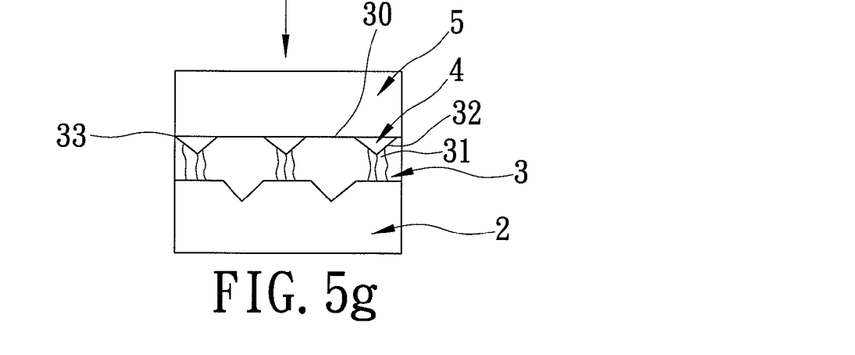

Referring to FIGS. 4 and 5g, there is shown the first preferred embodiment of an epitaxial structure having a low defect density according to this invention. The epitaxial structure includes a base layer 2, a first epitaxial layer 3 having a plurality of first recesses 32, a plurality of defect-termination blocks 4, and a second epitaxial layer 5.

The base layer 2 is patterned, and has a lattice mismatch with the first epitaxial layer 3, and a base surface 20 that includes a plurality of second recesses 21 and a plurality of flat surface portions 22 among the second recesses 21. The second recesses 21 are arranged in a matrix array, and have an average width ranging from 1 µm to 5 µm and an average depth not less than one fifth of the average width.

It is worth mentioning that the base layer 2 may have a flat surface which is not patterned. However, when the base layer 2 is patterned, defects originated from the lattice mismatching have a high tendency to spontaneously concentrate on the flat surface portions during growth of an epitaxial layer. As an alternative to the second recesses 21, the pattern of the base layer 2 may include strip-like pattern elements or irregular pattern elements (not shown).

The first epitaxial layer 3 is upwardly and laterally grown from the flat surface portions 22 and is made from gallium nitride (GaN). Alternatively, the first epitaxial layer 3 is a multilayer structure containing at least one nitride-based layer. The nitride-based layer includes a nitride compound selected from the group consisting of gallium nitride (GaN), aluminum nitride (AlN), aluminum gallium nitride ($Al_xGa_{1-x}N$, $0 \leq X \leq 1$), or combinations thereof. The first epitaxial layer 3 includes a plurality of concentrated defect groups 31, and an epitaxial surface 30 that has the first recesses 32 formed thereon corresponding in position to the top ends of the concentrated defect groups 31. The concentrated defect groups 31 are concentrated on the flat surface portions 22. The density of defects (not shown) is relatively low above the second recesses 21.

Preferably, the first recesses 32 have an average width ranging from 1 µm to 6 µm, more preferably, ranging from 2 µm to 4 µm, and most preferably, the first recesses 32 have an average width of 3 µm. The first recesses 32 have an average depth greater than 0.2 µm, and a standard deviation from the average depth of the first recesses 32 is not larger than 0.13 µm.

The defect-termination blocks 4 respectively and completely fill the first recesses 32 and have polished surfaces 41. The polished surfaces 41 are substantially flush with the epitaxial surface 30 to provide a substantially planarized crystal growth surface 33.

FIGS. 5a to 5g illustrate the consecutive steps of the first preferred embodiment of a method of making the epitaxial structure according to this invention.

Referring to FIGS. 5a and 5b, the base layer 2 is patterned and is formed with the second recesses through lithography techniques. The second recesses 21 are indented from the base surface 20 and are spaced apart from each other.

Referring to FIG. 5c, the first epitaxial layer 3 is formed on the patterned base layer 2 using lateral overgrowth techniques. The second recesses 21 may or may not be filled completely by the first epitaxial layer 3. Defects of the first epitaxial layer 3 will concentrate on the flat surface portions 22 either the second recesses 21 are filled completely or not. The defect density of the first epitaxial layer 3 is low on the second recesses 21 compared to that on the flat surface portions 22.

Referring to FIG. 5d, the first epitaxial layer 3 is etched using a wet etching agent so that the first epitaxial layer 3 has the first recesses 32 corresponding in position to the concentrated defect groups 31. Since the etching is carried out without using any mask, difficulties encountered in alignment of the mask can be avoided.

It is worth mentioning that the depth etched by the wet etching agent is larger in portions of the first epitaxial layer 3 where the defects are concentrated than in portions of the first epitaxial layer 3 where the density of the defects is low.

Figure 6:
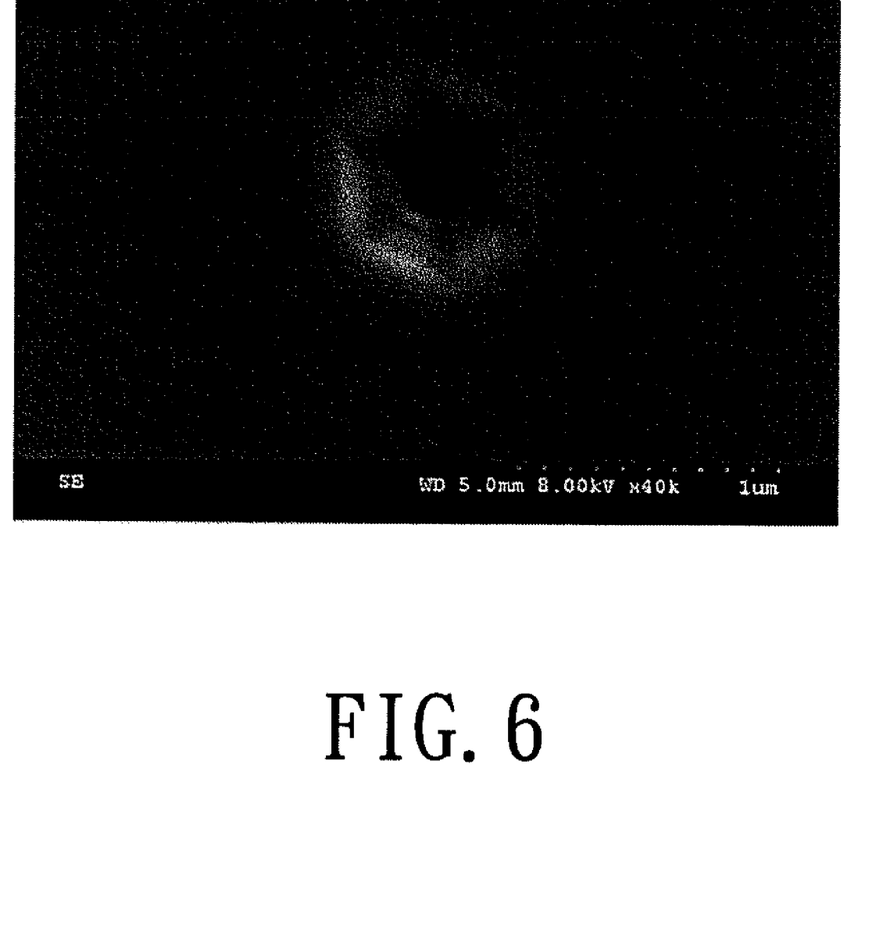
FIG. 6 is an image of a recess formed in the epitaxial layer of the first preferred embodiment of the present invention.

In this embodiment, the wet etching agent contains heated phosphoric acid, and has no sulfuric acid. Such etching agent can form hexagonal holes in the first epitaxial layer 3 when the defects are screw dislocations, but does not etch the first epitaxial layer 3 when the defects are edge dislocations. Accordingly, the first recesses 32 are formed on top ends of the screw dislocations. The first recesses 32 are hexagonal (see FIG. 6) when viewed from a top side of the first epitaxial layer 3, and are triangular in cross-section (see FIG. 4) when the first epitaxial layer 3 is sectioned along a vertical plane. The triangular cross section can be produced at initial time of wet etching. After wet etching is conducted out for a period of time, the cross section of the first recesses 32 can become trapezoidal or even irregular. Each of the concentrated defect groups 31 includes the screw dislocations.

Figure 7:
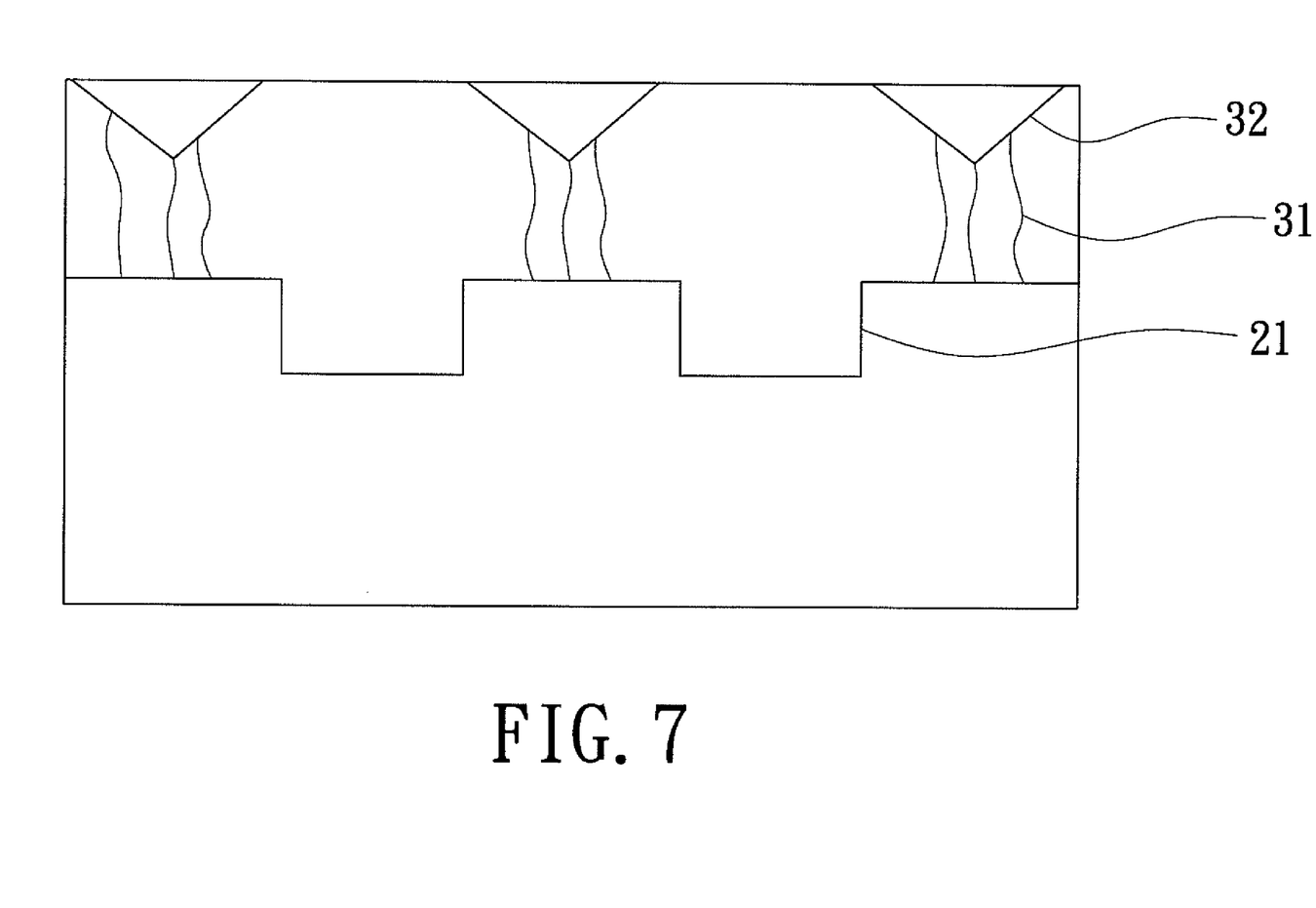
FIG. 7 is the same view as FIG. 4, but illustrating second recesses being rectangular in cross-section.
Figure 8:
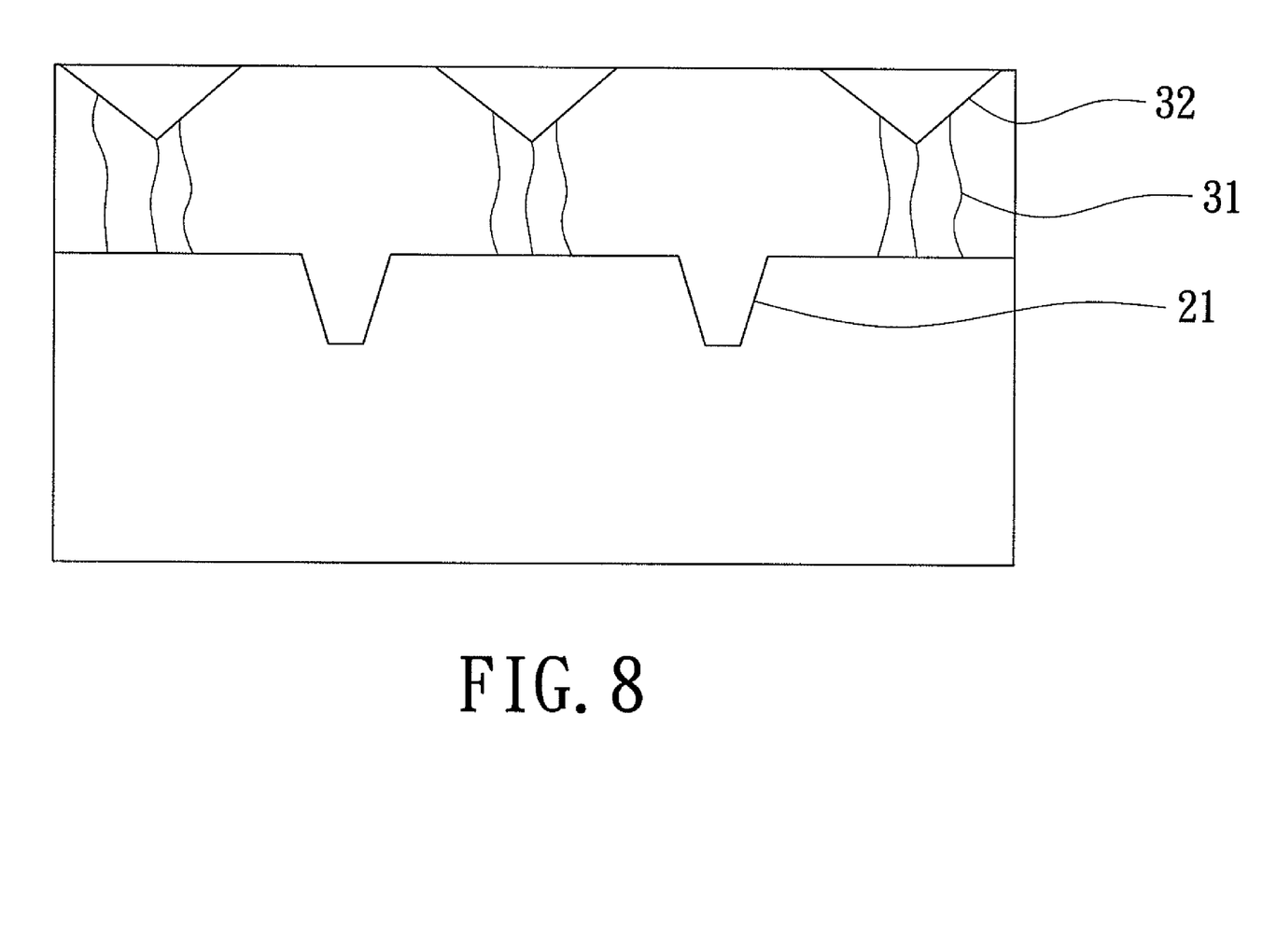
FIG. 8 is the same view as FIG. 4, but illustrating second recesses being trapezoidal in cross-section.

The second recesses 21 are triangular in cross-section (see FIG. 4) when formed by wet etching, and are rectangular, or trapezoidal (see FIGS. 7 and 8) when formed by dry etching.

Figure 9A:
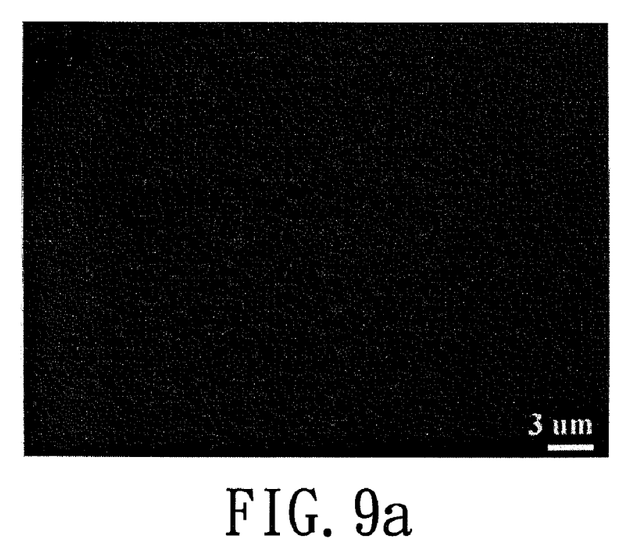
FIG. 9a is an image showing non-uniform recesses of the first preferred embodiment of the present invention when the base layer is not patterned.
Figure 9B:
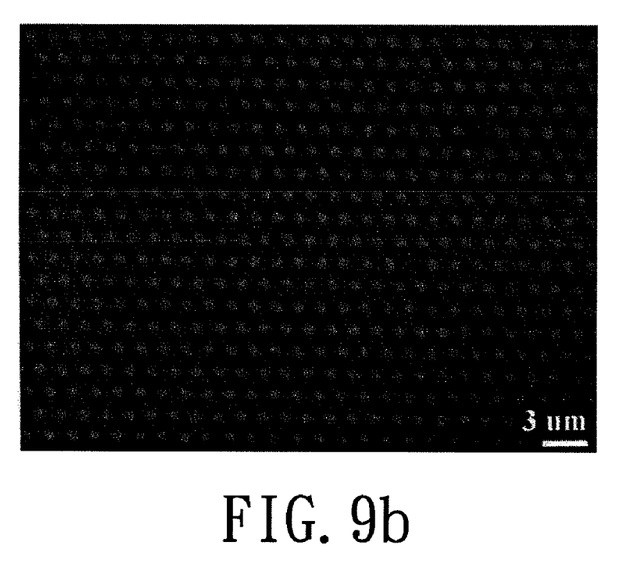
FIG. 9b is an image showing uniform recesses of the first preferred embodiment of the present invention when the base layer is patterned.

Referring to FIG. 9a, if the base layer 2 is not patterned for growth of the first epitaxial layer 3 thereon, the screw dislocations in the first epitaxial layer 3 can not be sufficiently concentrated during growth of the first epitaxial layer 3 so that the first recesses 32 cannot have uniform and sufficiently deep depth. On the contrary, referring to FIG. 9b, if the base layer 2 is patterned, the first recesses 32 can have uniform and deep depth, which is beneficial to prevent propagation of the defects therefrom.

In order to provide the first recesses 32 with a uniform size, the etching temperature is preferably not greater than 270° C. More preferably, the etching temperature is 200° C. so that the etching rate can be reduced. As a result, the first recesses 32 can have more uniform size, and the first recesses 32 can be prevented from merging. If the first recesses 32 merge, because the width of the recesses 32 and the size of the defect-termination blocks 4 will become large, the second epitaxial layer 5 (FIG. 5g) cannot make a good bonding at the positions where the large recesses exist.

Referring to FIG. 5e, after etching, a defect-termination layer 4' having a thickness larger than the depth of the first recesses 32 is deposited on the first epitaxial layer 3 so that the defect-termination layer 4' completely fills the first recesses 32 and covers the epitaxial surface 30.

Referring to FIG. 5f, the defect-termination layer 4' is removed by a chemical mechanical polishing process (CMP) until the epitaxial surface 30 is exposed, thereby forming a plurality of defect-termination blocks 4 that respectively and completely fill the first recesses 32 whereby the defect-termination blocks 4 have polished surfaces 41 that are substantially flush with the epitaxial surface 30 to provide the substantially planarized crystal growth surface 33. In this embodiment, a slurry containing colloidal silicon dioxide is used for the CMP process.

The defect-termination layer 4' that forms the defect-termination blocks 4 is made of a material which is different in removal rate from that of the first epitaxial layer 3.

Preferably, the defect-termination layer 4' is made from a material selected from the group consisting of an oxide, a nitride, a fluoride, a carbide, and combinations thereof. More preferably, the defect-termination layer 4' is made from a material selected from the group consisting of silicon dioxide, silicon nitride, titanium dioxide, and combinations thereof. In this embodiment, the defect-termination layer 4' is made from silicon dioxide.

In order to obtain good polishing effect, during the chemical mechanical polishing, the base layer 2 and the first epitaxial layer 3 are flattened by attaching the base layer 2 to a planar plate (not shown). In this embodiment, the planar plate is made of crystal wax, and the base layer 2 is adhered to the planar plate through a high vacuum pressure suction at a heated temperature.

Compared to other methods, such as ion reactive etching, the chemical mechanical polishing can remove the defect-termination layer 4' uniformly and quickly. The removal rate of the defect-termination layer 4' is different from that of the first epitaxial layer 3. Because the chemical mechanical polishing can also remove the first epitaxial layer 3 when removing the defect-termination layer 4', the defect-termination layer 4' should be made from a material that can be removed faster than the first epitaxial layer 3. Due to the presence of the defect-termination blocks 4, the epitaxial surface 30 of the first epitaxial layer 3 has a low defect density.

Referring to FIG. 5g, the second epitaxial layer 5 is formed on the crystal growth surface 33. Since the concentrated defect groups 31 are terminated by the defect-termination blocks 4, the second epitaxial layer 5 grown on the crystal growth surface 33 will have a defect density relatively lower than that of the first epitaxial layer 3, and is suitable for subsequent growth of semiconductor devices, such as a light-emitting device, a high-frequency communication device, and a field effect transistor, thereon.

Figure 10:
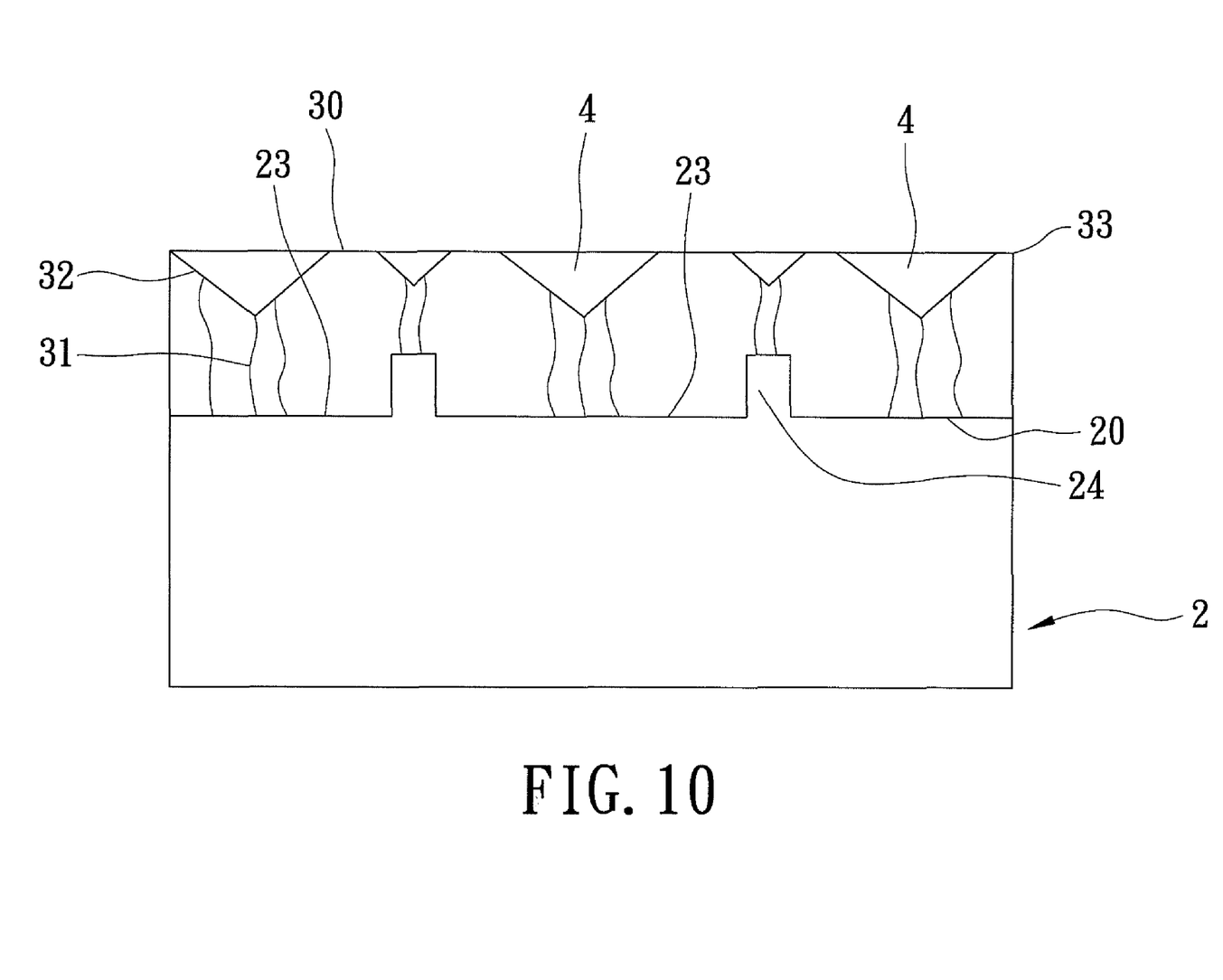
FIG. 10 is a schematic view of the second preferred embodiment of the epitaxial structure according to this invention.

Referring to FIG. 10, the second preferred embodiment of the present invention differs from the first embodiment in that the base layer 2 is patterned to form a plurality of protrusions 24 protruding from the base surface 20 and a plurality of protrusion-free surface portions 23. The concentrated defect groups are formed corresponding in position to the protrusion-free surface portions 23, and the first epitaxial layer 3 has a relatively low defect density on the protrusions 24.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An epitaxial structure having a low defect density, comprising:
   a base layer;
   a first epitaxial layer formed on said base layer and having a lattice mismatch with said base layer, said first epitaxial layer further having a plurality of concentrated defect groups, and an epitaxial surface that has a plurality of first recesses corresponding in position to said concentrated defect groups, the sizes of said first recesses being close to each other; and
   a plurality of defect-termination blocks respectively and filling said first recesses and having polished surfaces, said defect-termination blocks being made of a material which is different in removal rate from that of said first epitaxial layer, said polished surfaces being substantially flush with said epitaxial surface so that said first epitaxial layer has a substantially planarized crystal growth surface.

2. The epitaxial structure of claim 1, wherein said base layer is a patterned layer and has a base surface that includes a plurality of second recesses and a plurality of flat surface portions, said concentrated defect groups being concentrated on said flat surface portions, said first epitaxial layer having a relatively low defect density above said second recesses.

3. The epitaxial structure of claim 2, wherein said second recesses are arranged in a matrix array, and have an average width ranging from 1 μm to 5 μm and an average depth not less than one fifth of said average width.

4. The epitaxial structure of claim 1, wherein said base layer has a base surface formed with a plurality of protrusions and a plurality of protrusion-free surface portions, said concentrated defect groups corresponding in position to said protrusion-free surface portions, said first epitaxial layer having a relatively low defect density on said protrusions.

5. The epitaxial structure of claim 1, wherein said first epitaxial layer is made from gallium nitride.

6. The epitaxial structure of claim 1, wherein said first recesses have an average depth greater than 0.2 μm.

7. The epitaxial structure of claim 6, wherein a standard deviation from the average depth of said first recesses is not larger than 0.13 μm.

8. The epitaxial structure of claim 1, wherein said first recesses have an average width ranging from 1 μm to 6 μm.

9. The epitaxial structure of claim 8, wherein said first recesses have an average width ranging from 2 μm to 4 μm.

10. The epitaxial structure of claim 9, wherein said first recesses have an average width of 3 μm.

11. The epitaxial structure of claim 1, wherein said concentrated defect groups include screw dislocations, and said first recesses are formed on top ends of said screw dislocations.

12. The epitaxial structure of claim 1, further comprising a second epitaxial layer formed on said crystal growth surface of said first epitaxial layer and having a defect density lower than that of said first epitaxial layer.

* * * * *